(12) United States Patent
Naeem

(10) Patent No.: US 6,551,942 B2
(45) Date of Patent: Apr. 22, 2003

(54) METHODS FOR ETCHING TUNGSTEN STACK STRUCTURES

(75) Inventor: Munir D. Naeem, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 09/882,147

(22) Filed: Jun. 15, 2001

(65) Prior Publication Data

US 2002/0190025 A1 Dec. 19, 2002

(51) Int. Cl.[7] ............................................. H01L 21/302
(52) U.S. Cl. ...................... 438/714; 438/725; 438/734; 438/720; 438/719; 438/740
(58) Field of Search ............................. 438/714, 725, 438/734, 720, 719, 740

(56) References Cited

U.S. PATENT DOCUMENTS

| | | |
|---|---|---|
| 4,838,990 A | 6/1989 | Jucha et al. |
| 4,842,676 A | 6/1989 | Jucha et al. |
| 4,842,687 A | 6/1989 | Jucha et al. |
| 4,874,723 A | 10/1989 | Jucha et al. |
| 5,110,408 A | 5/1992 | Fujii et al. |
| 5,326,431 A | 7/1994 | Kadamura |
| 5,605,601 A | 2/1997 | Kawasaki |
| 5,670,018 A | 9/1997 | Eckstein et al. |
| 5,851,926 A | 12/1998 | Kumar et al. |
| 5,882,961 A | 3/1999 | Klingbell, Jr. et al. |
| 5,906,950 A | 5/1999 | Keller et al. |
| 5,914,511 A | 6/1999 | Noble et al. |
| 5,994,235 A | 11/1999 | O'Donnell |
| 6,027,975 A | 2/2000 | Hergenrother et al. |
| 6,066,869 A | 5/2000 | Noble et al. |
| 6,077,745 A | 6/2000 | Burnside et al. |
| 6,091,119 A | 7/2000 | Wu |
| 6,091,122 A | 7/2000 | Buchanan |
| 6,100,188 A | 8/2000 | Lu et al. |
| 6,100,193 A | 8/2000 | Suehiro et al. |
| 6,150,210 A | 11/2000 | Arnold |
| 6,150,670 A | 11/2000 | Faltermeier et al. |
| 6,177,698 B1 | 1/2001 | Gruening et al. |
| 6,184,091 B1 | 2/2001 | Grueing et al. |
| 6,200,851 B1 | 3/2001 | Arnold et al. |
| 6,277,763 B1 * | 8/2001 | Kugimiya et al. ........... 438/720 |
| 2001/0005622 A1 * | 6/2001 | Kim et al. ................... 438/592 |

FOREIGN PATENT DOCUMENTS

WO  01/29882  *  4/2001

* cited by examiner

Primary Examiner—George Goudreau
(74) Attorney, Agent, or Firm—Steven Capella

(57) ABSTRACT

The invention encompasses methods for etching and/or over-etching tungsten stack structures, especially tungsten-polysilicon stack structures. The etching methods of the invention preferably employ a $Cl_2/NF_3$ etchant, optionally including $O_2$ and/or helium. The over-etching methods of the invention preferably use a $NF_3/N_2/O_2$ etchant. The methods of the invention enable effective etching of tungsten-polysilicon stacks where topographic variation is present across the substrate and/or where other tungsten stacks of different structure are also being etched.

17 Claims, 3 Drawing Sheets

METHODS FOR ETCHING TUNGSTEN STACK STRUCTURES

BACKGROUND OF THE INVENTION

In the world of semiconductor electronics, the demand for increased device density and product performance continues to push the need for improved materials systems and the improved ability to configure those systems reliably at smaller dimensions.

With decreasing device size and/or altered device configuration, there is often a need to alter the materials used to make the devices in order to obtain the desired performance. Recently, in the area of dynamic random access memory (DRAM) and embedded DRAM design, there has been a shift to the use of vertical transistors for higher device density. See for example, U.S. Pat. Nos. 6,150,670; 6,177,698; 6,184,091; and 6,200,851, the disclosures of which are incorporated herein by reference. This design shift has resulted in DRAM device layout where the so-called support devices (e.g., transistors making up sensing and/or power supply circuitry) of the DRAM use planar transistors (channel being substantially parallel with the principal plane of the substrate) and the DRAM array cells use vertical transistors (channel being substantially perpendicular to the principal plane of the substrate).

In such configurations, the wordlines from the vertical transistors of the array reside at about the same level as the gate stacks of the support device transistors. With this configuration change, there has been a desire to manufacture the upper portion of the support device transistor gate stack from the same conductive material as is used to manufacture the wordlines. Generally, this has meant that at least the upper portion of the gate conductor (stack) should be made of a material of sufficient conductivity to act as wordline conductor. Some material such as tungsten silicide ($WSi_x$) which have been used in the upper portion of the gate stack are generally not considered adequate in such a configuration. Thus, there has been a desire to replace suicide materials with more conductive metals (e.g., to replace tungsten silicide with tungsten metal). For example, the use of tungsten metal is generally deemed necessary for gate conductors in 1 Gb DRAM applications which require lower sheet resistance.

Prior art methods for etching of gate stacks were primarily directed to tunsgten silicide-polycrystalline silicon stacks. Unfortunately, such etch methods typically provide insufficient polycrystalline silicon (polysilicon) etch selectivity for tungsten-polysilicon stacks, especially where (a) tungsten-polysilicon stacks in support devices and tungsten wordlines in the DRAM array stop on different layers (thin gate oxide in the support vs. thicker trench top oxide in the array), and/or (b) where significant topography may be present.

Thus, there is a need for improved etch protocols which perform the etch without punch-through of gate oxide and/or excess erosion of trench top oxide. There is also a need to provide such etch protocols which enable minimization of capital expenditure for additional processing equipment.

SUMMARY OF THE INVENTION

The invention encompasses new and improved methods for etching and/or over-etching tungsten stack structures, especially tungsten-polysilicon stack structures. The methods of the invention enable effective etching of tungsten stacks (especially tungsten-polysilicon stacks) even where topographic variation is present across the substrate and/or where other tungsten stacks of different structure are also being etched.

In one aspect, the invention encompasses a method of etching at least one stack structure on a substrate, the stack structure comprising at least one layer of tungsten metal over at least one layer of polycrystalline silicon, the method comprising:
 a) providing a first stack of material layers in a first area of the substrate, the first stack comprising a patterned mask over at least one layer of tungsten over at least one layer of polycrystalline silicon wherein portions of the tungsten layer are exposed at first spaces in the patterned mask,
 b) contacting the first stack with a first gaseous etchant composition comprising $Cl_2$ and $NF_3$ under reactive ion etching conditions to etch exposed portions of the tungsten layer.

Preferably, the first gaseous etchant further comprises He to improve endpoint control.

In another aspect, the invention encompasses a method of over-etching at least one stack structure on a substrate, the stack structure comprising at least one layer of tungsten metal over at least one layer of polycrystalline silicon, the method comprising:
 a) providing a first stack of material layers in a first area of the substrate, the first stack comprising a patterned mask over at least one layer of tungsten over at least one layer of polycrystalline silicon wherein portions of the tungsten layer are exposed at first spaces in the patterned mask, and
 b) contacting the stack with a gaseous etchant composition comprising $N_2$, $NF_3$ and $O_2$ under reactive ion etching conditions to etch tungsten at the first spaces selective to the polycrystalline silicon layer.

In another aspect, the invention encompasses a multi-step method for etching a tungsten-polycrystalline silicon stack where a first etch is performed with an etchant having good tungsten etch rate and/or sidewall profile control followed by an over-etch with an etchant having a polycrystalline silicon etch selectivity. The first etchant is preferably a $Cl_2/NF_3/O_2$ etchant described above. The high selectivity etchant is preferably a $N_2/NF_3/O_2$ etchant described above. The over-etch may be followed by any desired etch for configuring the polysilicon in the stack (e.g., a conventional polysilicon etch and polysilicon over-etch).

The tungsten-polycrystalline silicon stack preferably further comprises an oxide layer (e.g., a gate oxide) under the polycrystalline silicon layer.

The invention further encompasses methods using etchants of the invention to simultaneously etch a second stack in a second area of the substrate, the second stack comprising a patterned mask over at least one layer of tungsten over at least one layer of oxide, the second stack being substantially free of polycrystalline silicon layers between the tungsten layer and the oxide layer of the second stack, wherein portions of the tungsten layer are exposed at spaces in the patterned mask.

These and other aspects of the invention are described in further detail below.

DETAILED DESCRIPTION OF THE INVENTION

The invention encompasses new and improved methods for etching and/or over-etching tungsten stack structures, especially tungsten-polysilicon stacks. The methods of the invention enable effective etching of tungsten stacks (especially tungsten-polysilicon stacks) where topographic variation is present across the substrate and/or where other tungsten stacks of different structure are also being etched.

The etching methods of the invention are preferably generally characterized by the use of a $Cl_2/NF_3$ etchant in a dry etching process. The over-etching methods of the invention are preferably generally characterized by the use of an $NF_3/N_2/O_2$ etchant in a dry etching process. These methods may be used alone or in combination (as a multi-step etching method).

The stack structures used in the methods of the invention are preferably characterized by the presence of at least one tungsten-polysilicon stack having at least one layer of tungsten metal over at least one layer of polycrystalline silicon.

Figure 1:
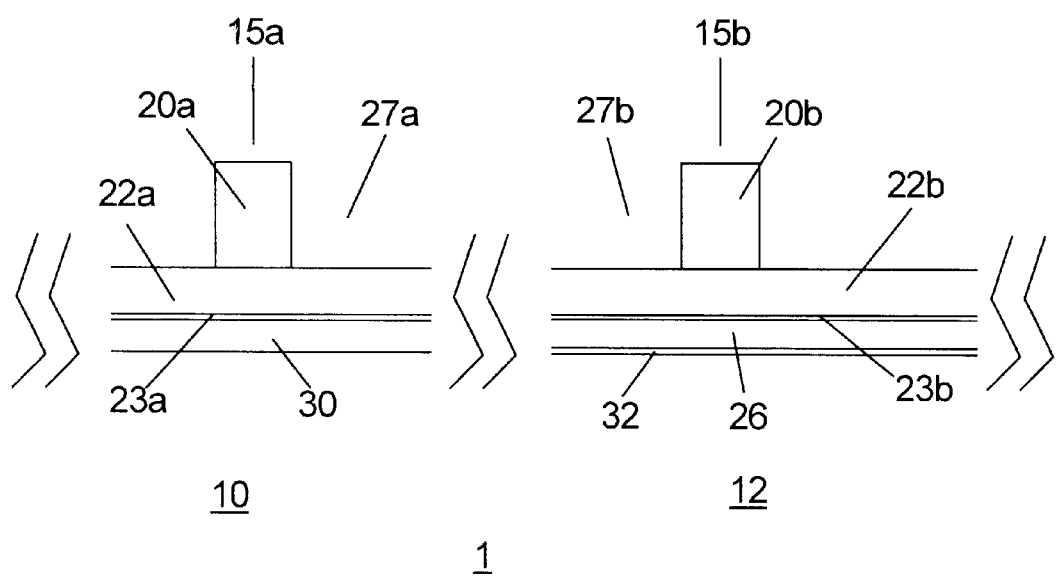
FIG. 1 is a schematic cross section of a tungsten wordline array stack and a tungsten support gate stack.

An example of a stack structure for a DRAM chip application is shown schematically in FIG. 1. It should be understood that the dimensions shown in the figures are for ease of illustration and do not necessarily reflect the actual size and/or relative scale of the individual layers to each other. The right side of FIG. 1 corresponds to a support device area 12. In the support device area, the stack 15b includes an oxide layer 32 over substrate 1. A polysilicon layer 26 is over oxide layer 32. An optional tungsten nitride barrier layer 23b is shown over polysilicon layer 26. A tungsten layer 22b is shown over tungsten nitride layer 23b. A mask 20b (preferably of silicon nitride) is present over tungsten layer 22b, the mask defining spaces 27b where the tungsten layer is exposed.

In the example DRAM device, the substrate would also typically be characterized by the presence of an array area 10 where the memory cells (not shown) making up the DRAM are located. Thus, a second type of stack structure 15a may be located in array area 10, e.g., corresponding to a wordline of the memory array. Such a second structure may comprise an oxide layer 30 (e.g., a so-called trench top oxide) on substrate 1. An optional tungsten nitride barrier layer 23a is shown over oxide layer 30. A tungsten layer 22a is shown over tungsten nitride layer 23a. A mask 20a (preferably of silicon nitride) is present over tungsten layer 22a, the mask defining spaces 27a where the tungsten layer is exposed.

It should be understood that the invention is not limited to the specific structures of FIG. 1. For example, the tungsten-polysilicon stack may contain additional layers, different barrier layer compositions, etc. The stack may not be present in certain devices and/or may be altered by the presence of additional layers, different barrier layer compositions, etc. Where the substrate is intended for a DRAM device, oxide layer 32 is typically intended to be a gate oxide for a support device transistor. Such a gate oxide layer would preferably have a thickness on the order of about 2–10 nm. In such an embodiment, the oxide layer 30 is typically intended to be trench top oxide. Such a trench top oxide layer would preferably have a thickness on the order of about 20–50 nm (more preferably, about 30–40 nm). Typically, a layer (not shown) of silicon nitride (e.g., about 10 nm) may be present below the trench top oxide 30. If desired, a thin layer (e.g., 1–3 nm) of sputtered silicon (not shown) may be deposited over oxide 30 in array area 10 to prevent etching of the oxide if CVD is used to deposit the tungsten/tungsten nitride. If such a thin sputtered silicon were employed, it would typically also be present over polysilicon layer 26 in support area 12.

While the structures shown in the Figures are fairly uniform, it should be noted that significant topography variations (primarily due to variation in height of isolation regions) may exist across the array of device structures on the chip and/or from chip to chip across the wafer. Thus, there is typically a requirement to over-etch tungsten for gate stack etch process which may impose a requirement of high tungsten/polysilicon selectivity to avoid support gate oxide punch-through.

Examples of DRAM structures and methods of making such structures are shown in U.S. Pat. Nos. 6,150,670; 6,177,698; 6,184,091; and 6,200,851. Other examples of tungsten-polysilicon gate stacks are shown in U.S. Pat. Nos. 6,091,122 and 6,100,188, the disclosures of which are incorporated herein by reference. It should be understood that the invention is not limited to any specific method for forming the tungsten stack structures to be etched.

In one aspect, the invention encompasses methods where the initial tungsten-polysilicon stack 15b, such as described in FIG. 1, is contacted with a first gaseous etchant composition comprising $Cl_2$ and $NF_3$ under reactive ion etching conditions (e.g., such as conditions provided by a LAM TCP 9400 etch tool) to etch exposed portions of the tungsten layer.

The ratio of $Cl_2/NF_3$ preferably ranges from about 0.7 to 1.5, more preferably from about 0.75 to 1.3, most preferably about 0.9 to 1.1. The chamber pressure (i.e., total gas pressure) is preferably about 2–10 mTorr, more preferably about 4–8 mTorr, most preferably about 4–6 mTorr. The TCP (top) power is preferably about 250–600 W, more preferably about 300–400 W, most preferably about 300 W. The bias (bottom) power is preferably about 50–350 W, more preferably about 75–200 W, most preferably about 75–100 W.

If desired, helium may be added to the gas mixture, preferably with the flow rates of the other gases reduced proportionately. For example, a typical flow rate of 50 sccm $Cl_2$ and 65 sccm $NF_3$ would be reduced to about 23 sccm $Cl_2$ and 30 sccm $NF_3$ with the addition of about 100 sccm He. He addition allows slowing of the W etch rate to improve end point detection. The profile is vertical without any punch through with full (W+poly) etch. It should be noted that this process variation can allow for at least about 60% tungsten overetch.

In general, the underlying topography influences the tungsten film thickness (i.e., the film becomes thicker with isolation feature height). This imposes the constraint of more tungsten overetch to avoid micromasking the underlying polysilicon which may occur if tungsten etch is not complete and the process is changed over to a high selectivity (gate oxide/poly) poly etch step for preventing gate oxide punch-through. To address this problem, it may be preferable to use a high tungsten/polysilicon selectivity protocol for tungsten overetch (or even perhaps as the main etch). Where an overetch step is desired, the termination of the main etch might be such that a portion of the tungsten layer 22a/22b remains as in FIG. 2 (to be removed by the overetch) for at least some of the stacks (assuming the chip to contain a multitude of stacks 15a and 15b). The target structure after the tungsten main etch and/or tungsten overetch (if used) is shown in FIG. 3 where the tungsten and tungsten nitride (if present) are removed.

The addition of $O_2$ in $Cl_2/NF_3$-based chemistry can enhance the tungsten/polysilicon selectivity although the increase in selectivity is not very high due to the formation of thin $Si_xO_yCl_z$ type complexes. The addition of $O_2$ in the main etch may be desired to improve selectivity relative to SiN (i.e., to reduce loss of the mask layer). A more preferred overetch solution is described below as a further aspect of the invention. If used, the about of $O_2$ is preferably less than the amount of $Cl_2$ used. Preferably, the flow of $O_2$ is about 5–30 sccm, more preferably about 10–20 sccm.

More specifically, another aspect of the invention is a method of etching or overetching at least one stack structure on a substrate, the stack structure comprising at least one layer of tungsten metal over at least one layer of polycrystalline silicon, the method comprising:
  a) providing a first stack of material layers in a first area of the substrate, the first stack comprising a patterned mask over at least one layer of tungsten over at least one layer of polycrystalline silicon wherein portions of the tungsten layer are exposed at first spaces in the patterned mask, and
  b) contacting the stack with a gaseous etchant composition comprising $N_2$, $NF_3$ and $O_2$ under reactive ion etching conditions to etch tungsten at the first spaces selective to the polycrystalline silicon layer.

$N_2$ is preferably present at about 5–50 sccm flow rate, more preferably about 10–30 sccm, most preferably about 10–20 sccm. $NF_3$ is preferably present at about 5–60 sccm flow rate, more preferably about 10–50 sccm, most preferably about 25–40 sccm. $O_2$ is preferably present at about 5–50 sccm flow rate, more preferably about 10–40 sccm, most preferably about 20–30 sccm. In general, it is preferred that the flow of $NF_3$ is greater than the individual flows of $N_2$ and $O_2$. The chamber pressure (i.e., total gas pressure) is preferably about 3–12 mTorr, more preferably about 4–10 mTorr, most preferably about 7 mTorr. The TCP (top) power is preferably about 200–400 W, more preferably about 250–350 W, most preferably about 250–300 W. The bias (bottom) power is preferably about 30–200 W, more preferably about 50–100 W, most preferably about 50–75 W.

A dilemma may occur that all the selectivity (W/poly) processes have an adverse effect on SiN (the mask material). This has two undesirable results: 1) the profile is less vertical and 2) the loss of cap nitride (the mask material) can occur. The profile is important for obvious reasons, and the excessive loss of cap nitride can lead to GC to all or GC-CB shorts.

To address this problem, the invention further encompasses a multi-step method for etching a tungsten-polycrystalline silicon stack where a first etch is performed with an etchant having good tungsten etch rate and/or sidewall profile control followed by an over-etch with an etchant having a polycrystalline silicon etch selectivity.

The first etchant is preferably a $Cl_2/NF_3/O_2$ etchant described above, more preferably an etchant comprising helium. A preferred first etchant contains about 20–30 sccm $Cl_2$ (more preferably, about 23 sccm), about 10–20 sccm $O_2$ (more preferably, about 14 sccm), about 25–35 sccm $NF_3$ (more preferably, about 30 sccm), and about 50–125 sccm He (more preferably, about 75–100 sccm). The first etch is preferably performed at a pressures and power settings described above, more preferably at about 4–6 mTorr pressure, about 300–400 top power and about 50–200 W bottom power.

The high selectivity etchant is preferably a $N_2/NF_3/O_2$ etchant described above. A preferred overetch uses 7 mTorr pressure, about 300 W top power, about 75 W bottom power, about 20 sccm $N_2$, about 25 sccm $NF_3$ and about 20 sccm $O_2$. The overetch is preferably done to about 60% or less. Tungsten overetch of 100% may be employed with no punch-through for support structures, but such conditions generally cause severe W undercut in the array.

The tungsten overetch may be followed by any desired etch protocol for configuring the polysilicon in the stack (e.g., a conventional polysilicon etch and polysilicon overetch). A preferred polysilicon etch chemistry employs a combination of $O_2$, HBr, and $Cl_2$. For example, a main polysilicon etch might employ about 20 mTorr pressure, about 300 W top power, about 50 W bottom power, about 10 sccm $Cl_2$, about 100 sccm HBr, about 12 sccm He—O (helium-containing oxygen) and about 100 sccm He. A typical polysilicon overetch might employ about 30 mTorr pressure, about 150 W top power, about 40 W bottom power, about 200 sccm HBr and about 3 sccm He—O.

The methods of the invention may be performed using any appropriate etching tool. Preferably, the methods of the invention are performed using a high density reactive ion etching tool such as Lam 9400 TCP and LAM PTX (Definium kit) etch reactors from Lam Corporation.

Figure 2:
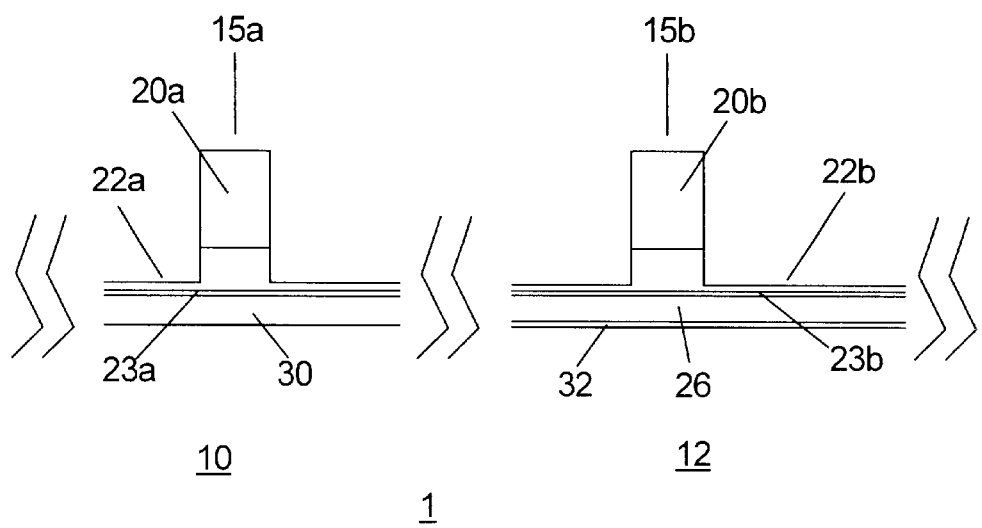
FIG. 2 is a schematic cross section of the stacks of FIG. 1 with the tungsten layer partially removed.
Figure 3:
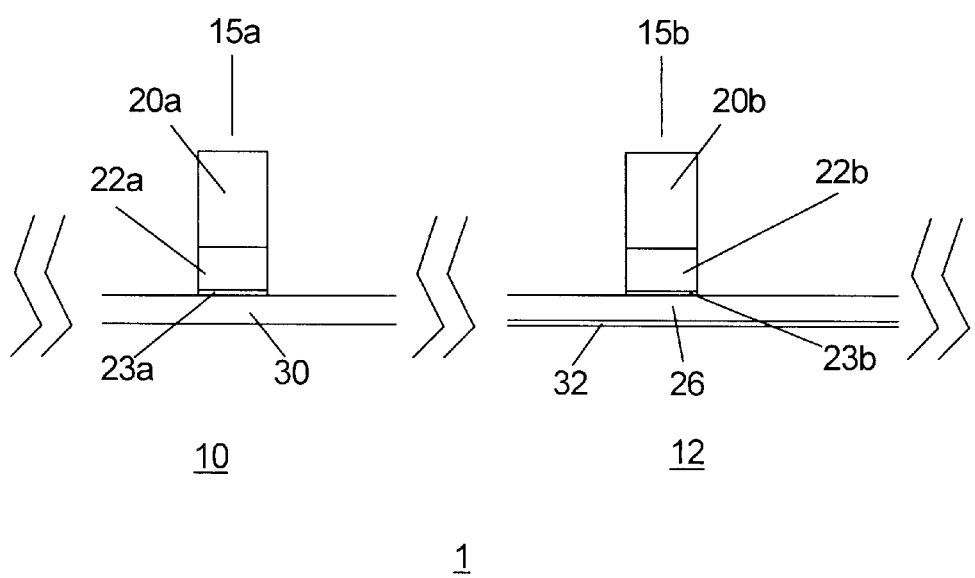
FIG. 3 is a schematic cross section of the stacks of FIG. 2 with the tungsten layer and optional tungsten nitride layer completely removed.

While the above discussion has been primarily with respect to the tungsten-polysilicon stack 15b of the support areas in FIGS. 1–3, it should be understood that the invention also encompasses the idea of simultaneously etching tungsten features in support areas and array areas (e.g., in the case of DRAM type layouts), or for etching of other structures where tungsten etching is required.

What is claimed is:

1. A method of etching at least one stack structure on a substrate, said stack structure comprising at least one layer of tungsten metal over at least one layer of polycrystalline silicon, said method comprising:
  a) providing a first stack of material layers in a first area of said substrate, said first stack comprising a patterned mask over at least one layer of tungsten over at least one layer of polycrystalline silicon wherein portions of said tungsten layer are exposed at first spaces in said patterned mask,
  b) contacting said first stack with a first gaseous etchant composition comprising $Cl_2$, $O_2$ and $NF_3$ under reactive ion etching conditions to etch exposed portions of said tungsten layer.

2. The method of claim 1 wherein said first gaseous etchant further comprises helium.

3. The method of claim 1 wherein said etching of step b) is conducted until said polycrystalline silicon layer is exposed at said first spaces.

4. The method of claim 1 further comprising:
  c) after step b), contacting said stack with a second gaseous etchant composition comprising $N_2$, $NF_3$, and $O_2$ under reactive ion etching conditions to over-etch any remaining tungsten at said first spaces selective to said polycrystalline silicon layer whereby said polycrystalline silicon layer is exposed at all first spaces of said mask.

5. The method of claim 1 wherein said first stack provided in step a) further comprises an oxide layer under said polycrystalline silicon layer.

6. The method of claim 5 wherein step a) further comprises providing a second stack in a second area of said substrate, said second stack comprising a patterned mask over at least one layer of tungsten over at least one layer of oxide, said second stack being substantially free of any polycrystalline silicon layers between said tungsten layer and said oxide layer of said second stack, wherein portions of said tungsten layer are exposed at spaces in said patterned mask.

7. The method of claim 6 wherein said oxide layer of said second stack has a thickness at least about one order of magnitude greater than a thickness of said oxide layer of said first stack.

8. The method of claim 7 wherein said oxide layer of said second stack has a thickness of at least about 20–50 nm and said oxide layer of said first stack has a thickness of 20–50 Å.

9. The method of claim 6 wherein step b) is continued until said polycrystalline silicon is removed at said first spaces and said oxide layer of said first stack is exposed in at least a portion of said first spaces.

10. A method of over-etching at least one stack structure on a substrate, said stack structure comprising at least one layer of tungsten metal over at least one layer of polycrystalline silicon, said method comprising:

a) providing a first stack of material layers in a first area of said substrate, said first stack comprising a patterned mask over at least one layer of tungsten over at least one layer of polycrystalline silicon wherein portions of said tungsten layer are exposed at first spaces in said patterned mask, and b) contacting said stack with a gaseous etchant composition comprising $N_2$, $NF_3$ and $O_2$ under reactive ion etching conditions to etch tungsten at said first spaces selective to said polycrystalline silicon layer.

11. The method of claim 10 wherein said etching step b) is conducted until said polycrystalline silicon layer is exposed at all first spaces of said mask.

12. The method of claim 10 wherein said tungsten at said spaces has been recessed relative to said tungsten under said mask prior to step b).

13. The method of claim 1 where step b) is performed using a high density reactive ion etching tool.

14. A method of etching at least one stack structure on a substrate, said stack structure comprising at least one layer of tungsten metal over at least one layer of polycrystalline silicon, said method comprising:

a) providing (i) a first stack of material layers in a first area of said substrate, said first stack comprising a patterned mask over at least one layer of tungsten over at least one layer of polycrystalline silicon over at least one layer of oxide wherein portions of said tungsten layer are exposed at first spaces in said patterned mask, and (ii) a second stack in a second area of said substrate, said second stack comprising a patterned mask over at least one layer of tungsten over at least one layer of oxide, said second stack being substantially free of any polycrystalline silicon layers between said tungsten layer and said oxide layer of said second stack, wherein portions of said tungsten layer are exposed at spaces in said patterned mask, b) contacting said first stack with a first gaseous etchant composition comprising $Cl_2$ and $NF_3$ under reactive ion etching conditions to etch exposed portions of said tungsten layer.

15. The method of claim 14 wherein said oxide layer of said second stack has a thickness at least about one order of magnitude greater than a thickness of said oxide layer of said first stack.

16. The method of claim 15 wherein said oxide layer of said second stack has a thickness of at least about 20–50 nm and said oxide layer of said first stack has a thickness of 20–50 Å.

17. The method of claim 15 wherein step b) is continued until said polycrystalline silicon is removed at said first spaces and said oxide layer of said first stack is exposed in at least a portion of said first spaces.

* * * * *